(12) United States Patent
Lin

(10) Patent No.: US 9,941,176 B2
(45) Date of Patent: Apr. 10, 2018

(54) SELECTIVE SOLDER BUMP FORMATION ON WAFER

(75) Inventor: Chin-Ming Lin, Jhunan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 948 days.

(21) Appl. No.: 13/476,290

(22) Filed: May 21, 2012

(65) Prior Publication Data

US 2013/0307142 A1 Nov. 21, 2013

(51) Int. Cl.
*H01L 21/66* (2006.01)
*G01R 31/28* (2006.01)
*H01L 23/00* (2006.01)
*H01L 23/29* (2006.01)

(52) U.S. Cl.
CPC ......... *H01L 22/20* (2013.01); *G01R 31/2855* (2013.01); *G01R 31/2856* (2013.01); *G01R 31/2879* (2013.01); *H01L 22/22* (2013.01); *H01L 24/11* (2013.01); *H01L 24/94* (2013.01); *H01L 22/14* (2013.01); *H01L 23/291* (2013.01); *H01L 24/13* (2013.01); *H01L 2224/0345* (2013.01); *H01L 2224/03912* (2013.01); *H01L 2224/0401* (2013.01); *H01L 2224/05022* (2013.01); *H01L 2224/05082* (2013.01); *H01L 2224/05124* (2013.01); *H01L 2224/05147* (2013.01); *H01L 2224/05572* (2013.01); *H01L 2224/05647* (2013.01); *H01L 2224/05655* (2013.01); *H01L 2224/1146* (2013.01); *H01L 2224/1147* (2013.01); *H01L 2224/11849* (2013.01); *H01L 2224/13111* (2013.01); *H01L 2224/94* (2013.01); *H01L 2924/00014* (2013.01)

(58) Field of Classification Search
CPC ......... H01L 22/32; H01L 22/22; H01L 22/14; G01R 31/2879; G01R 31/2855; G01R 31/2856

See application file for complete search history.

(56) References Cited

U.S. PATENT DOCUMENTS

| 5,937,320 | A | * | 8/1999 | Andricacos | ............. | H01L 24/03 257/E23.021 |
| 6,074,893 | A | * | 6/2000 | Nakata | ................ | H01L 21/4867 29/877 |
| 6,426,556 | B1 | * | 7/2002 | Lin | ......... | H01L 24/03 257/738 |
| 6,509,582 | B1 | * | 1/2003 | Bendall | .................... | H01L 24/02 257/48 |
| 6,514,779 | B1 | * | 2/2003 | Ryu | .................... | G01R 31/2831 257/E21.525 |
| 6,774,497 | B1 | * | 8/2004 | Qi | ......... | H01L 21/563 257/778 |
| 2002/0111009 | A1 | * | 8/2002 | Huang | .................... | H01L 24/03 438/613 |
| 2002/0135063 | A1 | * | 9/2002 | Alcoe | .................... | H01L 21/563 257/734 |

(Continued)

*Primary Examiner* — Zandra Smith
*Assistant Examiner* — Abbigale Boyle
(74) *Attorney, Agent, or Firm* — Hauptman Ham, LLP

(57) ABSTRACT

A method for selective bump formation on a wafer includes performing a wafer test on the wafer. Known good dies (KGDs) on the wafer are identified based on the wafer test performed. Solder bumps are formed on the KGDs.

20 Claims, 4 Drawing Sheets

(56) References Cited

U.S. PATENT DOCUMENTS

| | | | | |
|---|---|---|---|---|
| 2002/0142494 A1* | 10/2002 | Farnworth | .......... | H01L 21/4853 438/14 |
| 2003/0073300 A1* | 4/2003 | Chen | ....................... | H01L 24/03 438/613 |
| 2005/0151250 A1* | 7/2005 | Chiba | ................. | H01L 21/2885 257/738 |
| 2006/0220259 A1* | 10/2006 | Chen | ..................... | H01L 21/563 257/778 |

\* cited by examiner

SELECTIVE SOLDER BUMP FORMATION ON WAFER

TECHNICAL FIELD

The present disclosure relates generally to an integrated circuit and more particularly selective solder bump formation on a wafer.

BACKGROUND

In some integrated circuit fabrication processes, solder bumps are formed on the whole wafer resulting in wasted cost and decreased assembly yield when some of the dies on the wafer turn out to be defective dies.

BRIEF DESCRIPTION OF THE DRAWINGS

Reference is now made to the following descriptions taken in conjunction with the accompanying drawings, in which.

DETAILED DESCRIPTION

Figure 1:
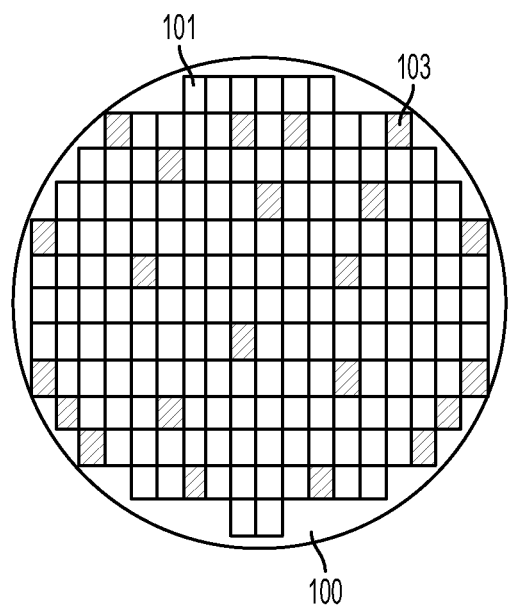
FIG. 1 is a schematic diagram of an exemplary wafer with bump dies and bump free dies by selective solder bump formation according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary wafer 100 with bump dies 101 and bump free dies 103 by selective solder bump formation according to some embodiments. The individual dies 101 and 103 on the wafer 100 are tested for functional defects by applying test patterns. The wafer testing is performed by test equipment such as a wafer prober. The process of wafer testing is referred to as Circuit Probe (CP), Wafer Sort (WS), Wafer Final Test (WFT), or Electronic Die Sort (EDS) among others, and can be performed using suitable methods known to one skilled in the art.

After the wafer testing, solder bumps are formed on known good dies (KGDs) for the bump dies 101 and bumping formation is skipped on defective dies for forming bump free dies 103. Since there is no bump formed on defective dies, cost is saved and bump/assembly yield is increased.

Figure 2:
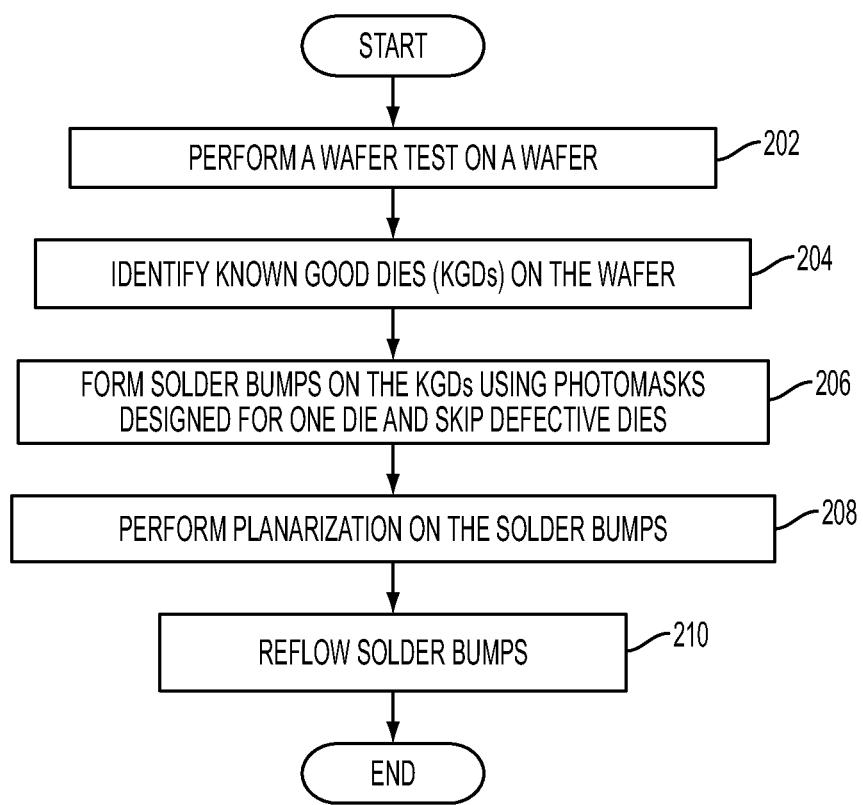
FIG. 2 is a flowchart of an exemplary method of selective solder bump formation for the wafer in FIG. 1 according to some embodiments.

FIG. 2 is a flowchart of an exemplary method of selective solder bump formation for the wafer in FIG. 1 according to some embodiments. At step 202, the wafer test is executed for each die on the wafer 100. At step 204, KGDs are identified, e.g., by generating a wafer map. The wafer test and generation of a wafer map can be performed by test equipment such as a wafer prober and/or any other suitable apparatus (such as computer) and methods known in the art. At step 206, solder bumps are formed on the KGDs using photo masks designed for one die and defective dies are skipped. The photo masks are used for photo-lithography processes and designed for each individual die so that each KGD is processed and each defective die can be skipped even when the KGD and the defective die are adjacent. At step 208, planarization is performed on solder bumps formed on the KGDs. The planarization is also performed on the defective dies simultaneously, but there are no bumps formed on the defective dies (i.e., bump free dies 103). At step 210, bump solders can be reflowed for bumping process, e.g., flip-chip bumping. More details of exemplary processes are described below.

Figure 3A:
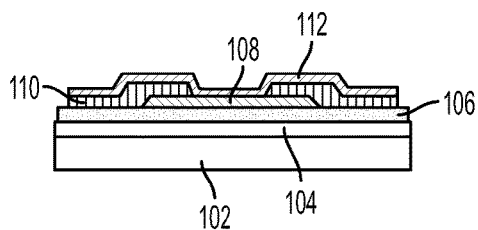
FIGS. 3A-3G are exemplary intermediate steps of fabricating bump dies in FIG. 1.

FIGS. 3A-3G are exemplary intermediate steps of fabricating bump dies 101 in FIG. 1. In FIG. 3A, a dielectric layer 104 such as inter-metal dielectric (IMD) is formed on a substrate 102 by chemical vapor deposition (CVD), for example. The dielectric layer 104 comprises $SiO_2$, low-k dielectric, SiC, TEOS, hard black diamond (HBD), SiOC, or any other suitable material with a thickness ranging from 500 Å to 5000 Å in some embodiments.

A metal layer 106 is formed on the dielectric layer 104 for electrical wiring, by physical vapor deposition (PVD), CVD, and/or chemical mechanical planarization (CMP), for example. The metal layer 106 comprises conductive material such as copper, aluminium, or any other suitable material. Multiple dielectric layers 104 and multiple metal layers 106 can be formed in some embodiments. A pad 108 is formed over the dielectric layer 104 for electrical connections by PVD or CVD, for example. The pad 108 comprises conductive material such as copper, aluminium, or any other suitable material.

A passivation layer 110 is formed over the pad 108 and the metal layer 106 by CVD, for example. The passivation layer 110 comprises SiC, TEOS, hard black diamond (HBD), SiN, or any other suitable material with a thickness ranging from 500 Å to 20000 Å in some embodiments.

After a wafer test, the die in FIG. 3A is determined to be a KGD. An adhesion under bump metal (UBM) layer 112 is formed over the passivation layer 110 by evaporation, sputtering, or chemical plating, for example. The adhesion UBM layer 112 comprises Ti/Cu in some embodiments.

Figure 3B:
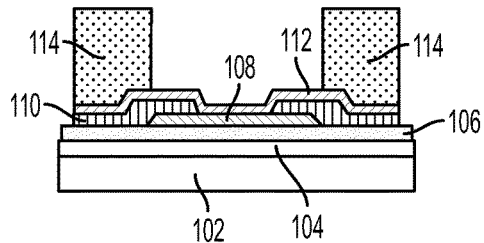

In FIG. 3B, photoresist layer 114 is deposited on the adhesion UBM layer 112 over substrate 102 and patterned by photolithography using photo masks. The patterned photoresist layer 114 is used for solder bump deposition.

Figure 3C:
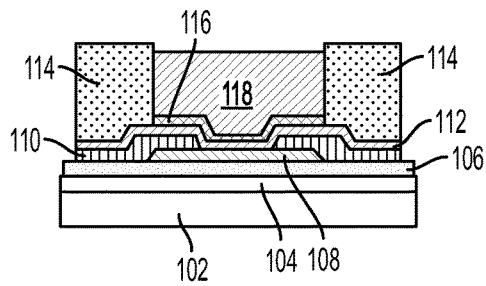

In FIG. 3C, a solder-wettable UBM layer 116 is formed over the adhesion UBM layer 112 by electroplating or chemical plating, for example. The solder-wettable UBM layer 116 comprises Cu/Ni in some embodiments. Even though the adhesion UBM layer 112 and the solder-wettable UBM layer 116 ("UBM layers") are shown as single layers, many different or additional layers can be formed as a part of the UBM layers 112 and 116. For example, a barrier layer such as Au can be added.

A solder bump 118 is formed over the UBM layers 112 and 116. The UBM layers 112 and 116 facilitate soldering using the solder bump 118 for electrical connections. The solder bump 118 can be a micro bump, general bump, a ball grid array (BGA) solder ball, or any other suitable solder structure. For example, some micro bumps may have a diameter ranging from about 10 μm to 40 μm, some general bumps may have a diameter ranging from about 80 μm to 120 μm, and some BGA solder balls may have a diameter ranging from about 240 μm to 400 μm. The solder bump 118 comprises solder materials such as Sn, Ag, Cu, any combination thereof, or any other suitable material.

The Solder bump 118 can be formed over the UBM layers 112 and 116 by various ways, including electroplating, chemical plating, or any other suitable method. The patterned photoresist layer 114 (using photo masks) helps to deposit the solder bump 118 in desired area. Even though one solder bump 118 is shown in the figures, it is understood that there can be multiple solder bumps 118 formed via the same process.

In the formation of the solder bumps 118, a local solder bump height of the solder bump 118 is adjusted based on a local density of solder bumps 118 in some embodiments. For example, if a density of solder bumps 118 is high, the local solder bump height can be increased considering pattern loading effect on the solder bump height from planarization in some embodiments. Similarly, if the density of solder bumps 118 is low, the local solder bump height can be decreased in some embodiments.

Figure 3D:
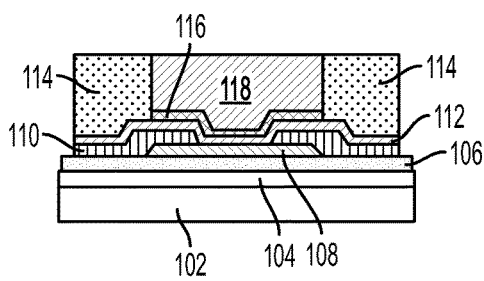

In FIG. 3D, the solder bump 118 is planarized by chemical mechanical planarization (CMP), for example. As mentioned above, the local solder bump height of the solder bump 118 can be adjusted prior to planarization to have even solder bump heights in some embodiments.

Figure 3E:
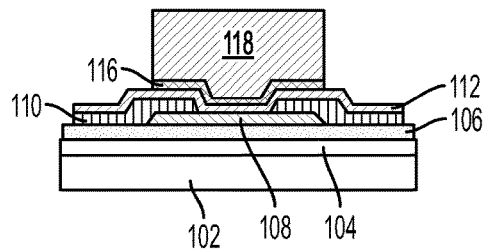

In FIG. 3E, the photoresist layer 114 is stripped by using organic strippers, wet inorganic strippers (oxidizing-type strippers), or dry etching using plasma etching equipment, for example.

Figure 3F:
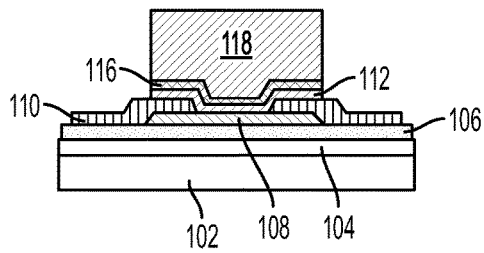

In FIG. 3F, the adhesion UBM layer 112 outside of the solder bump 118 is removed by etching, for example.

Figure 3G:
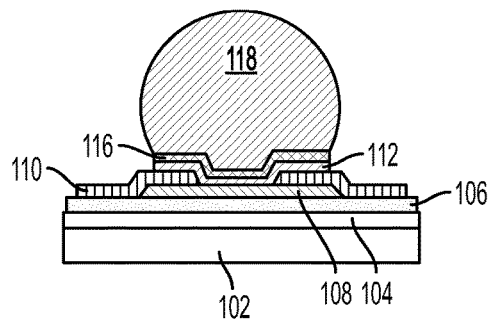

In FIG. 3G, the solder bump 118 is reflowed at or above melting point of the solder bump 118 for electrical connections such as flip-chip bonding.

Figure 4A:
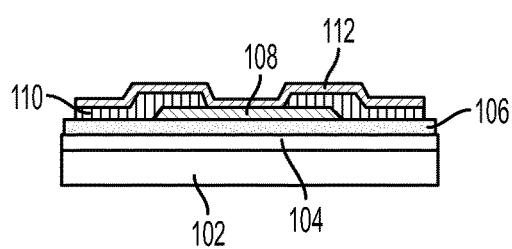
FIGS. 4A-4G are exemplary intermediate steps of fabricating bump free dies in FIG. 1.

FIGS. 4A-4G are exemplary intermediate steps of fabricating bump free dies 103 in FIG. 1. In FIG. 4A, a dielectric layer 104 such as inter-metal dielectric (IMD) is formed on a substrate 102 by chemical vapor deposition (CVD), for example. The dielectric layer 104 comprises $SiO_2$, low-k dielectric, SiC, TEOS, hard black diamond (HBD), SiOC, or any other suitable material with a thickness ranging from 500 Å to 5000 Å in some embodiments.

A metal layer 106 is formed on the dielectric layer 104 for wiring by physical vapor deposition (PVD), CVD, and/or chemical mechanical planarization (CMP), for example. The metal layer 106 comprises conductive material such as copper, aluminium, or any other suitable material. A pad 108 is formed over the dielectric layer 104 for electrical connections by PVD or CVD, for example. The pad 108 comprises conductive material such as copper, aluminium, or any other suitable material.

A passivation layer 110 is formed over the pad 108 and the metal layer 106 by CVD, for example. The passivation layer 110 comprises SiC, TEOS, hard black diamond (HBD), SiN, or any other suitable material with a thickness ranging from 500 Å to 20000 Å in some embodiments.

After a wafer test, the die in FIG. 4A is determined to be a defective die. An adhesion under bump metal (UBM) layer 112 is formed over the passivation layer 110 by evaporation, sputtering, or chemical plating, for example. The adhesion UBM layer 112 comprises Ti/Cu in some embodiments.

Figure 4B:
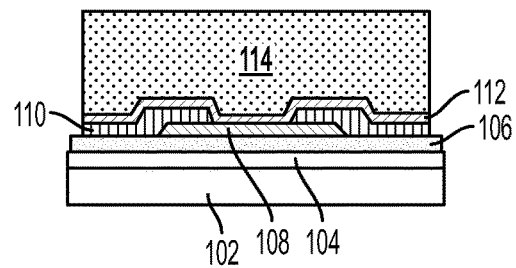

In FIG. 4B, photoresist layer 114 is deposited on the adhesion UBM layer 112 over substrate 102. However, the patterning process of the photoresist layer 114 by photo lithography using photo masks is skipped because it is determined that the die is a defective die.

Figure 4C:
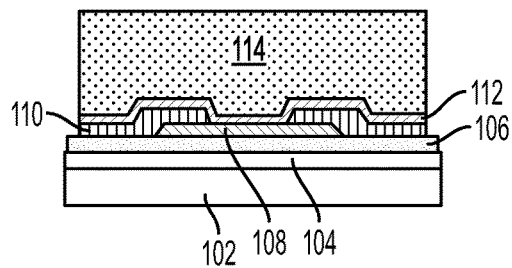

In FIG. 4C, the formation of an additional UMB layer such as the solder-wettable UBM layer 116 in FIG. 3C is skipped for the defective die. The deposition of the solder bump 118 in FIG. 3C is also skipped for the defective die.

Figure 4D:
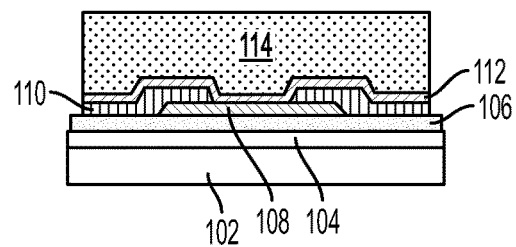

In FIG. 4D, the planarization process is performed on the whole wafer including defective dies. For the defective die, the photoresist 114 is planarized without a solder bump 118.

Figure 4E:
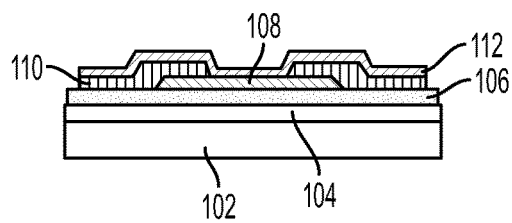

In FIG. 4E, the photoresist layer 114 is stripped by using organic strippers, wet inorganic strippers (oxidizing-type strippers), or dry etching using plasma etching equipment, for example.

Figure 4F:
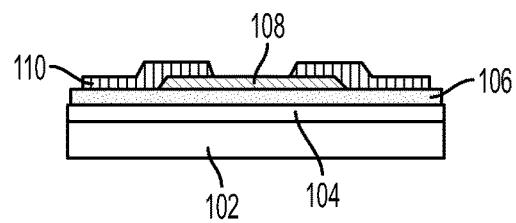

In FIG. 4F, the adhesion UBM layer 112 is removed by etching, for example.

Figure 4G:
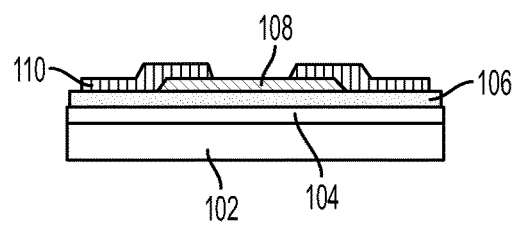

In FIG. 4G, while the solder bump 118 in FIG. 3G of the KGD is reflowed when the whole die is processed for solder reflow, the defective die does not have any solder bump 118 (i.e., a bump free die 103 in FIG. 1).

According to some embodiments, a method for selective bump formation on a wafer includes performing a wafer test on the wafer. Known good dies (KGDs) on the wafer are identified based on the wafer test performed. Solder bumps are formed on the KGDs.

According to some embodiments, a wafer includes at least one known good die (KGD) having solder bumps and at least one defective die having no solder bumps.

An ordinarily skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method for selective solder bump formation on a wafer, comprising:
   performing a wafer test on the wafer, the wafer comprising a plurality of dies;
   depositing a passivation layer over the wafer prior to the performing of the wafer test;
   identifying one or more known good dies (KGDs) of the plurality of dies based on the wafer test;
   identifying one or more defective dies of the plurality of dies based on the wafer test;
   depositing a first under bump metal (UBM) layer over a plurality of pads of the wafer, wherein the depositing the first UBM layer comprises depositing a continuous layer, and the passivation layer exposes each pad of the plurality of pads;
   depositing a photoresist layer over the wafer;
   selectively patterning the photoresist layer over the one or more KGDs using a photomask designed for one die of the plurality of dies to form an opening in the photoresist layer over each KGD of the one or more KGDs;
   skipping the patterning of the photoresist layer over the one or more defective dies;
   depositing a second UBM layer within the opening in the photoresist layer over the continuous layer of the first UBM layer for the each KGD of the one or more KGDs; and
   forming one or more solder bumps within the opening in the photoresist layer over a corresponding KGD of the one or more the KGDs, wherein the second UBM layer is between the one or more solder bumps and the wafer.

2. The method of claim 1, further comprising adjusting a local solder bump height based on a local density of the one or more solder bumps.

3. The method of claim 1, further comprising performing a planarization on the one or more solder bumps.

4. The method of claim 3, further comprising stripping the photoresist layer after the planarization.

5. The method of claim 1, wherein the solder bump formation process forms the one or more solder bumps by electroplating.

6. The method of claim 1, further comprising etching the first UBM layer over the one or more defective dies.

7. The method of claim 1, further comprising reflowing the one or more solder bumps.

8. A method for selective solder bump formation on a wafer, comprising:
   performing a wafer test on the wafer, the wafer comprising a plurality of dies;
   depositing a passivation layer over the wafer prior to the performing of the wafer test;
   identifying one or more known good dies (KGDs) of the plurality of dies based on the wafer test;
   identifying one or more defective dies of the plurality of dies based on the wafer test;
   depositing a titanium containing layer over pads of the wafer, wherein the titanium containing layer is a continuous layer over the pads of the wafer, and the passivation layer exposes the pads of the wafer;
   depositing a photoresist layer over the wafer;
   selectively patterning the photoresist layer over the one or more KGDs to form an opening in the photoresist layer over each KGD of the one or more KGDs using a photomask designed for one die of the plurality of dies to form the opening in the photoresist layer over each KGD of the one or more KGDs; and
   depositing a nickel containing layer on the titanium layer exposed by the opening in the photoresist layer over the each KGD of the one or more KGDs;
   forming one or more solder bumps over the wafer by:
      performing a solder bump formation process on each of the one or more KGDs, wherein the solder bump formation process forms at least one solder bump within the opening in the photoresist layer over a corresponding KGD of the one or more the KGDs; and
      skipping the solder bump formation process on the one or more defective dies; and
   performing a planarization on the one or more solder bumps and the photoresist layer over the one or more KGDs and on the photoresist layer over the one or more defective dies.

9. The method of claim 8, further comprising adjusting a local solder bump height based on a local density of the one or more solder bumps.

10. The method of claim 8, wherein the depositing of the titanium containing layer comprises depositing the titanium containing layer prior to forming the one or more solder bumps.

11. The method of claim 8, wherein the planarization is performed on the one or more solder bumps and the photoresist layer over the one or more KGDs and the photoresist layer over the one or more defective dies simultaneously.

12. A method for selective solder bump formation on a wafer, the method comprising:
   performing a wafer test on the wafer, the wafer comprising a plurality of dies;
   depositing a passivation layer over the wafer prior to the performing of the wafer test;
   identifying one or more known good dies (KGDs) of the plurality of dies based on the wafer test;
   identifying one or more defective dies of the plurality of dies based on the wafer test;
   depositing a first under bump metal (UBM) layer on the wafer, wherein the first UBM layer is continuous across a plurality of pads on the wafer, and the passivation layer exposes each pad of the plurality of pads;
   depositing a photoresist layer on the wafer;
   selectively patterning the photoresist layer over the one or more KGDs using a photomask designed for one die of the plurality of dies to form an opening in the photoresist layer over each KGD of the one or more KGDs;
   skipping the patterning of the photoresist layer over the one or more defective dies;
   depositing a second UBM layer on a portion of the continuous first UBM layer exposed by the opening in the photoresist layer over each KGD of the one or more KGDs; and
   forming one or more solder bumps over the wafer by:
      performing a solder bump formation process on the each KGD of the one or more KGDs, wherein the solder bump formation process forms at least one solder bump within the opening in the photoresist layer over a corresponding KGD of the one or more the KGDs, wherein each solder bump of the at least one solder bump is connected to a single KGD of the one or more KGDs; and
      skipping the solder bump formation process on the one or more defective dies;
   performing a planarization over an entirety of the wafer, wherein the one or more solder bumps on the one or more KGDs and the photoresist layer over the one or more defective dies are planarized.

13. The method of claim 12, further comprising:
adjusting a local solder bump height before performing the planarization, the adjustment of the local solder bump height being based on a relationship between a local density of the one or more solder bumps and a loading effect associated with the planarization.

14. The method of claim 12,
wherein the depositing of the second UBM layer comprises:
skipping the second UBM layer deposition process over the one or more defective dies.

15. The method of claim 14, further comprising:
removing the first UBM layer over the one or more defective dies.

16. The method of claim 1, further comprising:
generating a wafer map including the one or more KGDs; and
using the photomask designed for one die based on the wafer map.

17. The method of claim 1, wherein at least one KGD of the one or more KGDs is adjacent at least one of the one or more defective dies.

18. The method of claim 17, wherein the patterning of the photoresist layer over a first KGD of the at least one KGD using the photomask designed for one die, and the patterning of the photoresist layer over a second KGD of the at least one KGD using the photomask designed for one die, occur sequentially.

19. The method of claim 1, wherein the depositing of the second UBM layer comprises:
skipping the second UBM deposition over the one or more defective dies.

20. The method of claim 1, further comprising performing flip-chip bonding on each KGD of the one or more KGDs by reflowing corresponding one or more solder bumps.

\* \* \* \* \*